(12) United States Patent
Nakajima

(10) Patent No.: US 10,847,747 B2
(45) Date of Patent: Nov. 24, 2020

(54) DISPLAY DEVICE

(71) Applicant: Japan Display Inc., Minato-ku (JP)

(72) Inventor: Shinji Nakajima, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 126 days.

(21) Appl. No.: 15/940,025

(22) Filed: Mar. 29, 2018

(65) Prior Publication Data

US 2018/0287094 A1 Oct. 4, 2018

(30) Foreign Application Priority Data

Apr. 3, 2017 (JP) ................. 2017-073967

(51) Int. Cl.
*H01L 51/52* (2006.01)
*H01L 27/32* (2006.01)
(52) U.S. Cl.
CPC ...... *H01L 51/5253* (2013.01); *H01L 51/5246* (2013.01); *H01L 27/3246* (2013.01); *H01L 27/3258* (2013.01); *H01L 51/525* (2013.01)
(58) Field of Classification Search
CPC .................. H01L 51/5253; H01L 51/5246
See application file for complete search history.

(56) References Cited

U.S. PATENT DOCUMENTS

2015/0021565 A1 1/2015 Min et al.
2015/0221895 A1* 8/2015 Sato ................. H01L 27/3213
257/40
2016/0163777 A1* 6/2016 Ozawa ............. H01L 51/5246
257/40

FOREIGN PATENT DOCUMENTS

JP 2015-23023 2/2015

\* cited by examiner

*Primary Examiner* — Marcos D. Pizarro
*Assistant Examiner* — Antonio B Crite
(74) *Attorney, Agent, or Firm* — Oblon, McClelland, Maier & Neustadt, L.L.P.

(57) ABSTRACT

A display device according to an embodiment of the present invention includes: one or a plurality of display elements provided in a display region; and an organic sealing film provided above the display element in the display region and a picture-frame region outside the display region, the organic sealing film being formed of an organic insulating material, the organic sealing film including, in at least a portion of the picture-frame region, a high surface portion whose surface is higher than a surface of the organic sealing film in the display region.

4 Claims, 6 Drawing Sheets

DISPLAY DEVICE

CROSS-REFERENCE TO RELATED APPLICATION

The present application claims priority from Japanese Application JP2017-73967 filed on Apr. 3, 2017, the content of which is hereby incorporated by reference into this application.

BACKGROUND OF THE INVENTION

1. Field of the Invention

The present invention relates to a display device and a manufacturing method thereof.

2. Description of the Related Art

In a display device such as an organic EL display device, a portion such as a light emitting layer or an upper electrode included in a display element is formed by evaporation using a mask, and the display element is sealed by a sealing film (see JP 2015-023023 A).

SUMMARY OF THE INVENTION

When a portion of the display element is formed by evaporation using a mask as described above, the mask may contact the periphery of a display region, resulting in attachment of a foreign substance. The presence of such a foreign substance involves the risk that, even when the sealing film is provided, moisture or oxygen easily enters from the portion.

One or more embodiments of the present invention have been made in view of the problem, and an object thereof is to provide a display device capable of achieving an improvement in the barrier properties of a sealing film, and a manufacturing method of the display device.

A display device according to an embodiment of the present invention includes: one or a plurality of display elements provided in a display region; and an organic sealing film provided above the display element in the display region and a picture-frame region outside the display region, the organic sealing film being formed of an organic insulating material, the organic sealing film including, in at least a portion of the picture-frame region, a high surface portion whose surface is higher than a surface of the organic sealing film in the display region.

A manufacturing method of a display device according to an embodiment of the present invention includes: forming, using a mask covering a picture-frame region outside a display region, one or a plurality of display elements in the display region; and forming an organic sealing film formed of an organic insulating material in the display region and the picture-frame region, the organic sealing film being formed so as to include, in at least a portion of the picture-frame region, a high surface portion whose surface is higher than a surface of the organic sealing film in the display region.

DETAILED DESCRIPTION OF THE INVENTION

Figure 1:
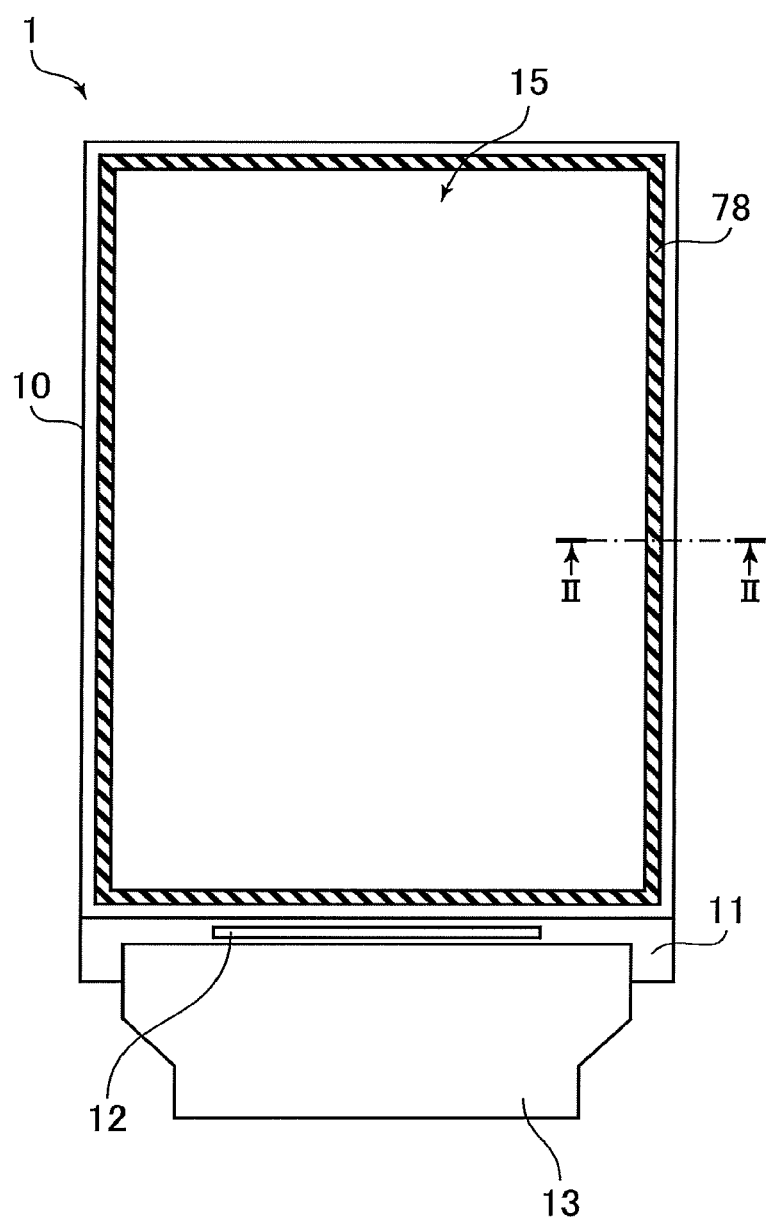
FIG. 1 is a plan view showing an example of a display device according to an embodiment.

Hereinafter, each embodiment of the invention will be described with reference to the drawings. The disclosure is illustrative only. Appropriate modifications that will readily occur to those skilled in the art and fall within the spirit of the invention are of course included in the scope of the invention. In the drawings, the width, thickness, shape, and the like of each part may be schematically represented, compared to those in embodiments, for more clarity of description. However, they are illustrative only, and do not limit the interpretation of the invention. Moreover, in the specification and the drawings, elements similar to those described in relation to a previous drawing are denoted by the same reference numerals and signs, and a detailed description may be appropriately omitted.

Further, in the detailed description of the embodiments of the invention, the terms "on" and "below" as used in defining the positional relationship between one component and another component include, not only the case where one component is located directly on or directly below another component, but also the case where still another component intervenes between the components unless otherwise noted.

Figure 2:
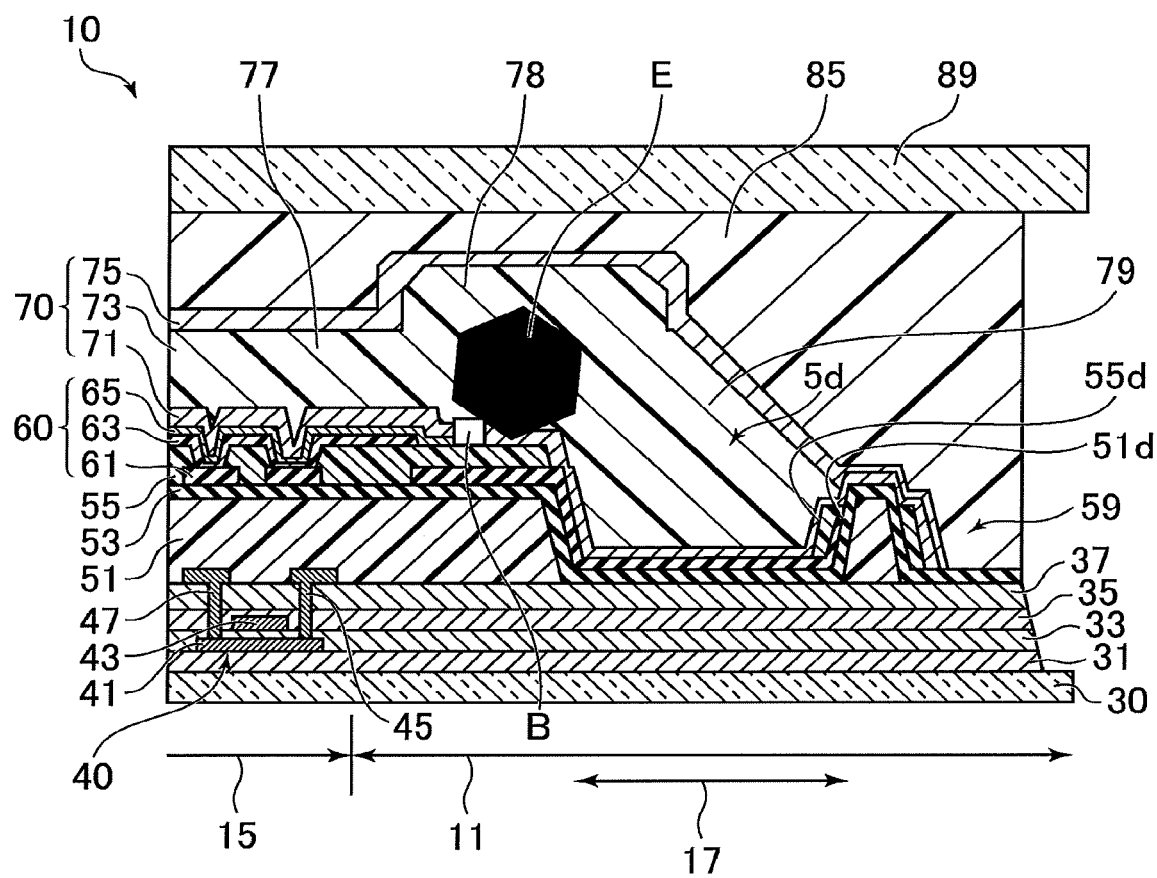
FIG. 2 is a cross-sectional view taken along line II-II shown in FIG. 1.

FIG. 1 is a plan view showing an example of a display device according to an embodiment. FIG. 2 is a cross-sectional view taken along line II-II shown in FIG. 1. As an example of the display device, an organic EL display device is mentioned. The display device 1 is configured such that a full-color pixel is formed by combining unit pixels (sub-pixels) of multiple colors including, for example, red, green, and blue to thereby display a full-color image.

The display device 1 includes a display panel 10. A picture-frame region (peripheral region) 11 is formed outside a display region 15 of the display panel 10. An integrated circuit chip 12 for driving pixels is mounted in the picture-frame region 11, and a flexible printed board (FPC) 13 for electrical connection with the outside is connected to the picture-frame region 11.

A substrate 30 is made of, for example, glass or resin having flexibility such as polyimide. The upper surface of the substrate 30 is covered by an undercoat layer 31. A semiconductor layer 41 is formed on the undercoat layer 31, and the semiconductor layer 41 is covered by a gate insulating film 33. A gate electrode 43 is formed on the gate insulating film 33, and the gate electrode 43 is covered by passivation films 35 and 37. A drain electrode 45 and a source electrode 47 penetrate the gate insulating film 33 and the passivation films 35 and 37, and are connected to the semiconductor layer 41. The semiconductor layer 41, the gate electrode 43, the drain electrode 45, and the source electrode 47 constitute a thin film transistor 40. The thin film transistor 40 is provided so as to correspond to each of a plurality of unit pixels.

The drain electrode 45 and the source electrode 47 are covered by a planarization film 51, and the planarization film 51 is covered by an interlayer insulating film 53. The undercoat layer 31, the gate insulating film 33, the passivation films 35 and 37, and the interlayer insulating film 53 are formed of, for example, an inorganic insulating material such as SiO$_2$, SiN, or SiON. The semiconductor layer is configured of, for example, semiconductor such as low-temperature poly-silicon (LTPS). The drain electrode 45 and the source electrode 47 are formed of, for example, a conductive material containing Al, Ag, Cu, Ni, Ti, Mo, or the like. The planarization film 51 is formed of, for example, an organic insulating material such as acrylic resin, and includes a flat upper surface.

A moisture blocking region 17 for suppressing the entry of moisture is provided in the picture-frame region 11. The moisture blocking region 17 is formed in a frame shape so as to surround the display region 15. The planarization film 51 is an example of an organic interlayer film. The planarization film 51 is provided in the display region 15 and the picture-frame region 11, and is divided in the moisture blocking region 17. That is, a dividing groove 51*d* by which the planarization film 51 is divided is formed in the moisture blocking region 17. The interior of the dividing groove 51*d* is covered by the interlayer insulating film 53, and further covered by a conductor film 613 in the same layer as pixel electrodes 61 to be described later.

The pixel electrodes 61 (e.g., anodes) are formed on the interlayer insulating film 53. Although not shown in the drawing, the pixel electrode 61 penetrates the planarization film 51 and the interlayer insulating film 53 and is connected to the source electrode 47. The pixel electrodes 61 are individually provided so as to respectively correspond to the plurality of unit pixels. In the embodiment, the display panel 10 is of a top emission type, and the pixel electrode 61 is formed as a reflecting electrode. The pixel electrode 61 is formed to include, for example, a conductive material containing Al, Ag, Cu, Ni, Ti, Mo, or the like, or a conductive oxide such as ITO or IZO.

The pixel electrode 61 is covered by a pixel separation film 55. The pixel separation film 55 is also called a rib or a bank. An opening where the pixel electrode 61 is exposed at the bottom is formed in the pixel separation film 55. The inner edge portion of the pixel separation film 55 forming the opening lies on the peripheral edge portion of the pixel electrode 61. The pixel separation film 55 has a forward tapered shape in which the width is narrowed from the bottom toward the top in cross-section. The pixel separation film 55 is formed of, for example, an organic insulating material such as acrylic resin or polyimide resin.

The pixel separation film 55 is also an example of the organic interlayer film. The pixel separation film 55 is provided in the display region 15 and the picture-frame region 11, and is divided in the moisture blocking region 17. That is, a dividing groove 55*d* by which the pixel separation film 55 is divided is formed in the moisture blocking region 17. The dividing groove 55*d* of the pixel separation film 55 is formed so as to overlap the dividing groove 51*d* of the planarization film 51 in a plan view. A portion of the pixel separation film 55 that is located on the outside of the dividing groove 55*d* is provided in a wider area than that of a portion of the planarization film 51 that is located on the outside of the dividing groove 51*d*, so as to cover the portion of the planarization film 51.

A light emitting layer 63 is formed on the pixel electrode 61 exposed at the bottom of the opening of the pixel separation film 55. In the embodiment, the light emitting layer 63 is formed by evaporation as a uniform film (so-called solid film) that extends over the entire display region 15. In this case, the light emitting layer 63 emits light of a single color (e.g., white), and the components of the respective multiple colors including, for example, red, green, and blue are extracted by color filters or color conversion layers.

The light emitting layer 63 is not limited to this, and the light emitting layers 63 may be individually formed separately from each other. In this case, the light emitting layers 63 emit light of multiple colors including, for example, red, green, and blue respectively corresponding to the plurality of unit pixels. At least one layer of a hole transport layer, a hole injection layer, an electron transport layer, and an electron injection layer may be formed together with the light emitting layer 63.

The light emitting layer 63 and the pixel separation film 55 are covered by a counter electrode 65 (e.g., a cathode). The counter electrode 65 is formed as a uniform film that extends over the entire display region 15. The light emitting layer 63, and the pixel electrode 61 and the counter electrode 65 interposing the light emitting layer therebetween constitute a light emitting element (display element) 60. The light emitting layer 63 emits light with a current flowing between the pixel electrode 61 and the counter electrode 65. The counter electrode 65 is formed of, for example, a transparent conductive material such as ITO or IZO, or a metal thin film of MgAg or the like.

The pixel separation film 55 and the counter electrode 65 are covered and thus sealed by a sealing film (passivation film) 70, and therefore is shielded from moisture. A cover film 89 made of PET or the like is disposed on the sealing film 70 with an adhesive layer 85 therebetween. The sealing film 70 has, for example, a three-layer stacked structure including an inorganic film 71, an organic film 73, and an inorganic film 75 in this order from the bottom. The inorganic films 71 and 75 are formed of, for example, an inorganic insulating material such as SiO$_2$, SiN, or SiON. The organic film 73 is formed of, for example, an organic insulating material such as acrylic resin, and planarizes the upper surface of the sealing film 70.

In the embodiment, the organic film 73 of the sealing film 70 is an example of an organic sealing film, and is provided in the display region 15 and the picture-frame region 11. The organic film 73 fills the dividing grooves 51*d* and 55*d* of the planarization film 51 and the pixel separation film 55 formed in the moisture blocking region 17. That is, a recess 5*d* corresponding to the omitted portions of the planarization film 51 and the pixel separation film 55 is formed in the moisture blocking region 17, and the organic film 73 fills the recess 5*d*.

The outer edge of the organic film 73 reaches the outer side walls of the dividing grooves 51*d* and 55*d* of the planarization film 51 and the pixel separation film 55. That is, a dam portion 59 formed of the portion of the planarization film 51 located on the outside of the dividing groove 51*d* and the portion of the pixel separation film 55 located on the outside of the dividing groove 55*d* is provided outside the moisture blocking region 17. The outer edge of the organic film 73 reaches the inner side wall (i.e., the outer side walls of the dividing grooves 51*d* and 55*d*) of the dam portion 59.

The organic film 73 includes a high surface portion 78 in at least a portion of the picture-frame region 11. The surface of the high surface portion 78 is higher than the surface of the other portion of the organic film 73. That is, the organic film 73 is raised at the high surface portion 78. Specifically, the surface of the high surface portion 78 is higher than the surface of a covering portion 77 of the organic film 73 that covers the display region 15. Moreover, above the planarization film 51 and the pixel separation film 55, the high surface portion 78 is thicker than the covering portion 77.

The high surface portion 78 is formed in a frame shape that surrounds the display region 15 (see FIG. 1). The high surface portion 78 does not need to completely surround the display region 15, and may be discontinuous at some midpoint.

The high surface portion 78 is formed in at least an area of the picture-frame region 11 that is located on the inside of the dividing grooves 51d and 55d. That is, the high surface portion 78 is formed so as to be located at least above the planarization film 51 and the pixel separation film 55 on the inside of the dividing grooves 51d and 55d in the picture-frame region 11.

The high surface portion 78 is formed not only in the area on the inside of the dividing grooves 51d and 55d but also in an area above the dividing grooves 51d and 55d. That is, the high surface portion 78 is formed above the planarization film 51 and the pixel separation film 55 and above the dividing grooves 51d and 55d so as to cross over the inner side walls of the dividing grooves 51d and 55d in a plan view.

The organic film 73 includes, outside the high surface portion 78, an inclined surface 79 extending downward toward the outside. The inclined surface 79 is formed in a frame shape that surrounds the high surface portion 78 in an area above the dividing grooves 51d and 55d. The inclined surface 79 extends to the outer side walls of the dividing grooves 51d and 55d, and forms the outer edge of the organic film 73.

According to the embodiment described above, by providing the high surface portion 78 in the organic film 73, even when a foreign substance E is present above the planarization film 51 and the pixel separation film 55 in the picture-frame region 11, the entry of moisture or oxygen can be suppressed to improve the barrier properties of the sealing film 70.

That is, if the high surface portion 78 is not provided in the organic film 73, the organic film 73 cannot completely cover the foreign substance E attached to the picture-frame region 11 during deposition, involving the risk that the light emitting element 60 is damaged due to the entry of moisture or oxygen from a gap between the organic film 73 and the foreign substance E. Especially when the pixel separation film 55 has a flaw B on its surface, the moisture or oxygen entering from the gap between the organic film 73 and the foreign substance E easily reaches the light emitting element 60.

In contrast, when the high surface portion 78 is provided in the organic film 73 as in the embodiment, it can be expected that the high surface portion 78 covers the entire foreign substance E and closes the gap between the organic film 73 and the foreign substance E. Therefore, it is possible to suppress the entry of moisture or oxygen.

Moreover, by reducing the thickness of the covering portion 77 covering the display region 15 while providing the high surface portion 78 in the organic film 73 as in the embodiment, it is possible to ensure the transmittance of the covering portion 77 and suppress the degradation of a light amount to be extracted to the outside.

FIGS. 3 to 6 are process diagrams showing an example of a manufacturing method of the display device according to an embodiment.

Figure 3:
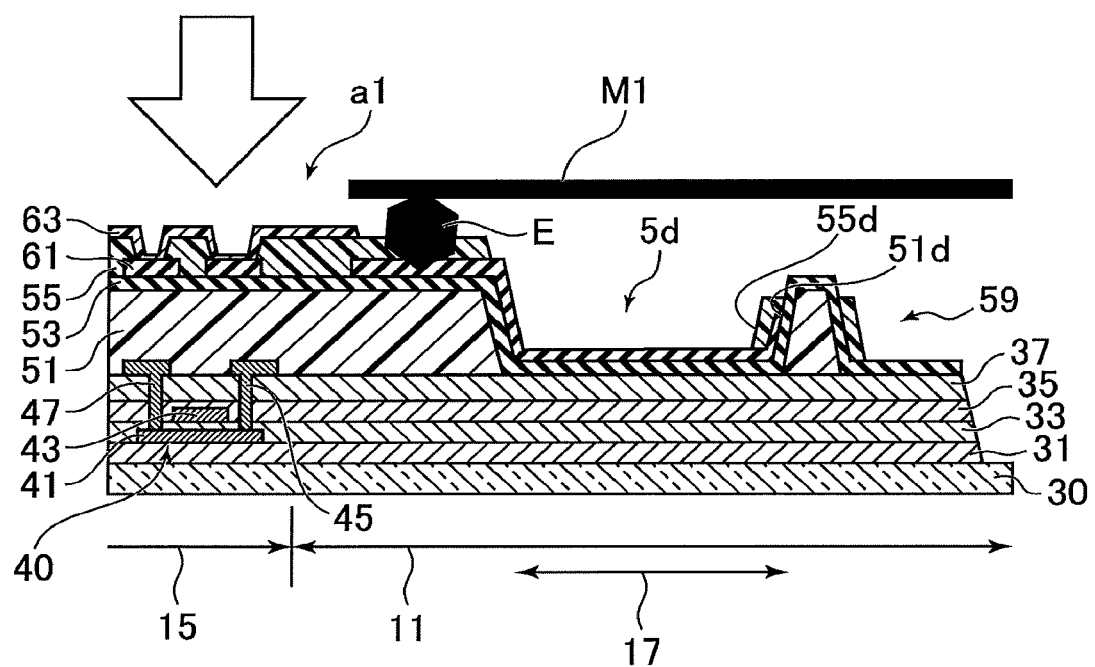
FIG. 3 is a process diagram showing an example of a manufacturing method of the display device according to an embodiment.

FIG. 3 shows a light emitting layer forming process for forming the light emitting layer 63 of the light emitting element 60. The light emitting layer 63 is formed by evaporation using a mask M1 covering the picture-frame region 11. The mask M1 includes an opening a1 corresponding to an area where the light emitting layer 63 is formed. In the drawing, the mask M1 for forming the light emitting layer 63 as a uniform film (so-called solid film) that extends over the entire display region 15 is shown; however, the mask is not limited to this, and a mask for forming the light emitting layers 63 to be individually separated from each other may be used. The mask M1 is used in contact with, or close to, the surface of the pixel separation film 55; therefore, the foreign substance E may be attached to the surface of the pixel separation film 55, or a flaw may be generated thereon.

Figure 4:
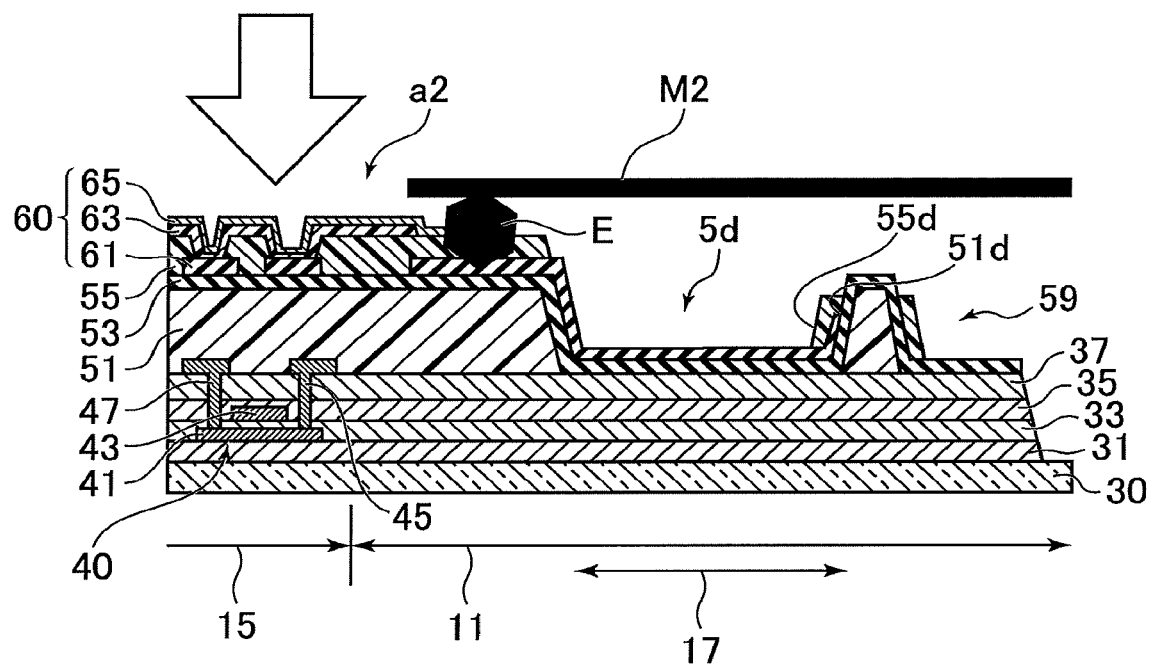
FIG. 4 is a diagram subsequent to FIG. 3.

FIG. 4 shows a counter electrode forming process for forming the counter electrode (upper electrode) 65 of the light emitting element 60. The counter electrode 65 is also formed by evaporation using a mask M2 covering the picture-frame region 11. The mask M2 includes an opening a2 corresponding to an area where the counter electrode 65 is formed. The counter electrode 65 is formed as a uniform film that extends over the entire display region 15. The mask M2 is also used in contact with, or close to, the surface of the pixel separation film 55; therefore, the foreign substance E may be attached to the surface of the pixel separation film 55, or a flaw may be generated thereon.

Figure 5:
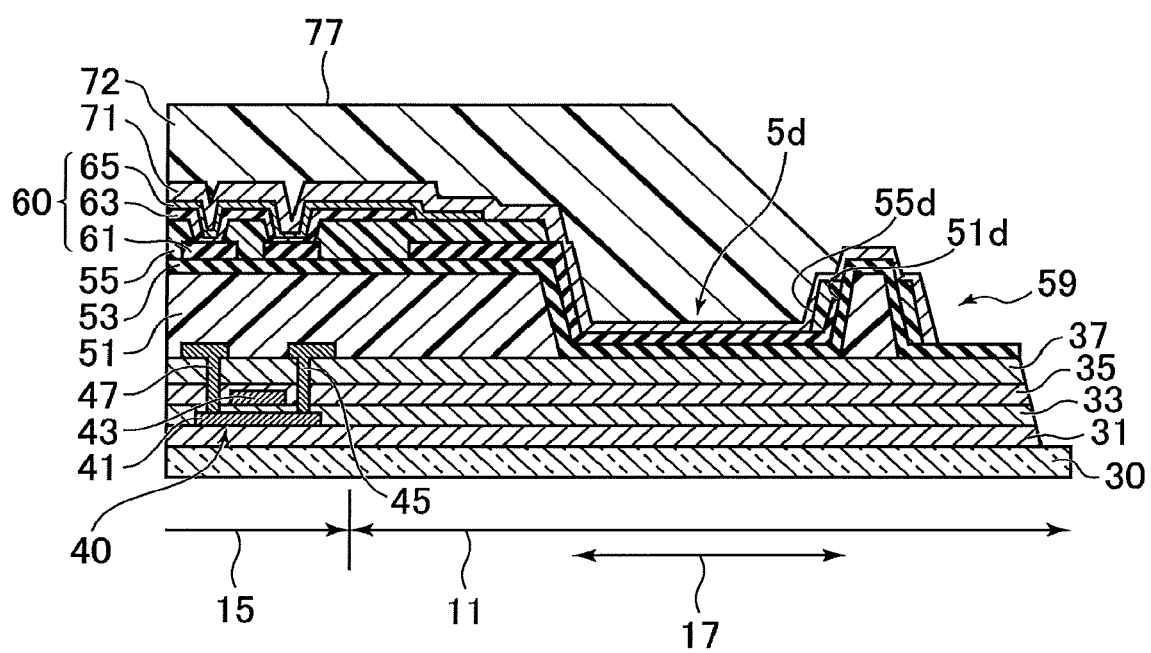
FIG. 5 is a diagram subsequent to FIG. 4.
Figure 6:
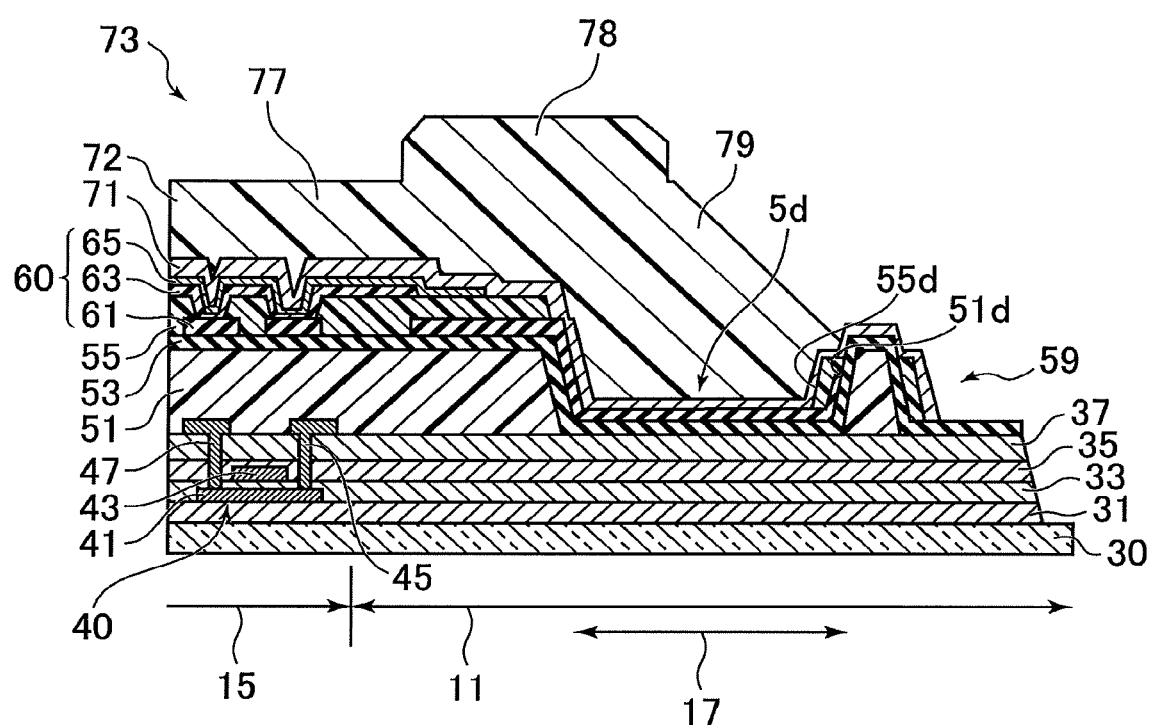
FIG. 6 is a diagram subsequent to FIG. 5.

FIGS. 5 and 6 show an organic film forming process for forming the organic film 73 of the sealing film 70. The organic film 73 is formed on the inorganic film 71 after the inorganic film 71 covering the counter electrode 65 and the like is formed. The organic film 73 is, for example, print-formed by a printing method.

FIG. 5 shows a first process of the organic film forming process. In the first process, a base film 72 serving as a portion of the organic film 73 is print-formed. The base film 72 is formed as a uniform film that extends over and around the display region 15. With the formation of the base film 72, a portion of the organic film 73 that corresponds to the covering portion 77 covering the display region 15 is formed. The peripheral edge portion of the base film 72 fills the recess 5d formed in the moisture blocking region 17, and is dammed up by the dam portion 59 formed outside the dividing grooves 51d and 55d.

FIG. 6 shows a second process of the organic film forming process. In the second process, a portion corresponding to the high surface portion 78 is print-formed in a predetermined area on the base film 72. Thereafter, the organic film 73 is completed through a drying process. Due to this, the high surface portion 78 whose surface is higher than that of the covering portion 77 covering the display region 15 is formed. In the embodiment, printing is performed twice separately; however, printing is not limited to this, and the high surface portion 78 may be formed by, for example, increasing the discharge amount of a material, or reducing the speed of a header, in an area where the high surface portion 78 is to be formed.

Thereafter, the inorganic film 75 is formed on the organic film 73, and the cover film 89 is disposed on the inorganic film 75 with the adhesive layer 85 therebetween, so that the display panel 10 is completed (see FIG. 2).

In the embodiment, an organic EL display device has been exemplified as an example of the disclosure. However, other application examples include all types of flat panel display devices such as a liquid crystal display device and other self-emitting display devices, or an electronic paper display device including an electrophoretic element. Moreover, it is needless to say that the invention can be applied, without particular limitations, to small and medium to large sized display devices.

Various variations and modifications are conceivable by those skilled in the art within the scope of the idea of the invention, and it will be understood that all such variations and modifications also fall within the scope of the invention.

For example, when those skilled in the art appropriately modify the embodiments described above by addition, deletion, or design change of components, or by addition, omission, or condition change of processes, all such modifications also fall within the scope of the invention as long as they contain the gist of the invention.

What is claimed is:

1. A display device comprising:
one or a plurality of display elements provided in a display region;
an organic sealing film provided above the display element in the display region and a picture-frame region outside the display region, the organic sealing film being formed of an organic insulating material, the organic sealing film including, in at least a portion of the picture-frame region, a high surface portion whose surface is higher than a surface of the organic sealing film in the display region; and
one or a plurality of organic interlayer films provided below the organic sealing film in the display region and the picture-frame region, the organic interlayer film being formed of an organic insulating material, the organic interlayer film being formed with a dividing groove by which the organic interlayer film is divided in the picture-frame region, wherein
the organic sealing film fills the dividing groove, and an outer edge of the organic sealing film reaches an outer side wall of the dividing groove, and
the high surface portion is formed in at least an area of the picture-frame region that is located on an inside of the dividing groove.

2. The display device according to claim 1, wherein
the high surface portion is formed in a frame shape that surrounds the display region.

3. The display device according to claim 1, wherein
the high surface portion is also formed in an area on the dividing groove.

4. The display device according to claim 1, wherein
the organic sealing film includes, outside the high surface portion, an inclined surface extending downward toward an outside.

* * * * *